(12) United States Patent
McKinnon et al.

(10) Patent No.: US 6,747,874 B2
(45) Date of Patent: Jun. 8, 2004

(54) RACK SYSTEM WITH REAR STATUS INDICATOR AND METHOD OF USE

(75) Inventors: Wayne E. McKinnon, Georgetown, TX (US); Robert J. Neville, Jr., Round Rock, TX (US); Ralph W. Jensen, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 25 days.

(21) Appl. No.: 10/292,222

(22) Filed: Nov. 12, 2002

(65) Prior Publication Data

US 2004/0090749 A1 May 13, 2004

(51) Int. Cl.⁷ .............................. G06F 1/16; H05K 7/20
(52) U.S. Cl. ................... 361/724; 361/727; 312/223.1; 312/298; 211/26; 340/635; 710/303; 710/100
(58) Field of Search ................................ 361/724–727, 361/683; 312/223.1, 298; 710/303, 304, 100–104; 211/26, 175; 340/635, 686

(56) References Cited

U.S. PATENT DOCUMENTS

| | | | | |
|---|---|---|---|---|
| 5,216,579 A | * | 6/1993 | Basara et al. ............... | 361/683 |
| 5,460,441 A | * | 10/1995 | Hastings et al. ............ | 312/298 |
| 5,461,717 A | * | 10/1995 | Notarianni et al. ......... | 710/303 |
| 5,754,112 A | * | 5/1998 | Novak ........................ | 340/635 |
| 5,764,913 A | | 6/1998 | Jancke et al. .......... | 395/200.54 |
| 6,148,352 A | * | 11/2000 | Coale et al. ................ | 710/100 |
| 6,157,534 A | * | 12/2000 | Gallagher et al. .......... | 361/683 |
| 6,281,860 B1 | | 8/2001 | Ahrens, Jr. et al. ........... | 345/30 |
| 6,305,556 B1 | * | 10/2001 | Mayer ......................... | 211/26 |
| 6,396,409 B1 | | 5/2002 | Yeh ....................... | 340/815.42 |
| 6,429,783 B1 | | 8/2002 | Reyes et al. ............. | 340/815.4 |
| 6,594,150 B2 | * | 7/2003 | Creason et al. ............. | 361/727 |
| 2003/0197619 A1 | * | 10/2003 | Lawrence et al. .......... | 340/635 |

* cited by examiner

Primary Examiner—Lisa Lea-Edmonds
(74) Attorney, Agent, or Firm—Baker Botts L.L.P.

(57) ABSTRACT

An information handling system status indicator assembly includes a power jack, cabling and an indicator. The status indicator assembly connects with a status port located at the rear of an information handling system component and operates to provide a visible status indication of the component on the components cable management assembly and visible from a position behind the rack.

20 Claims, 4 Drawing Sheets

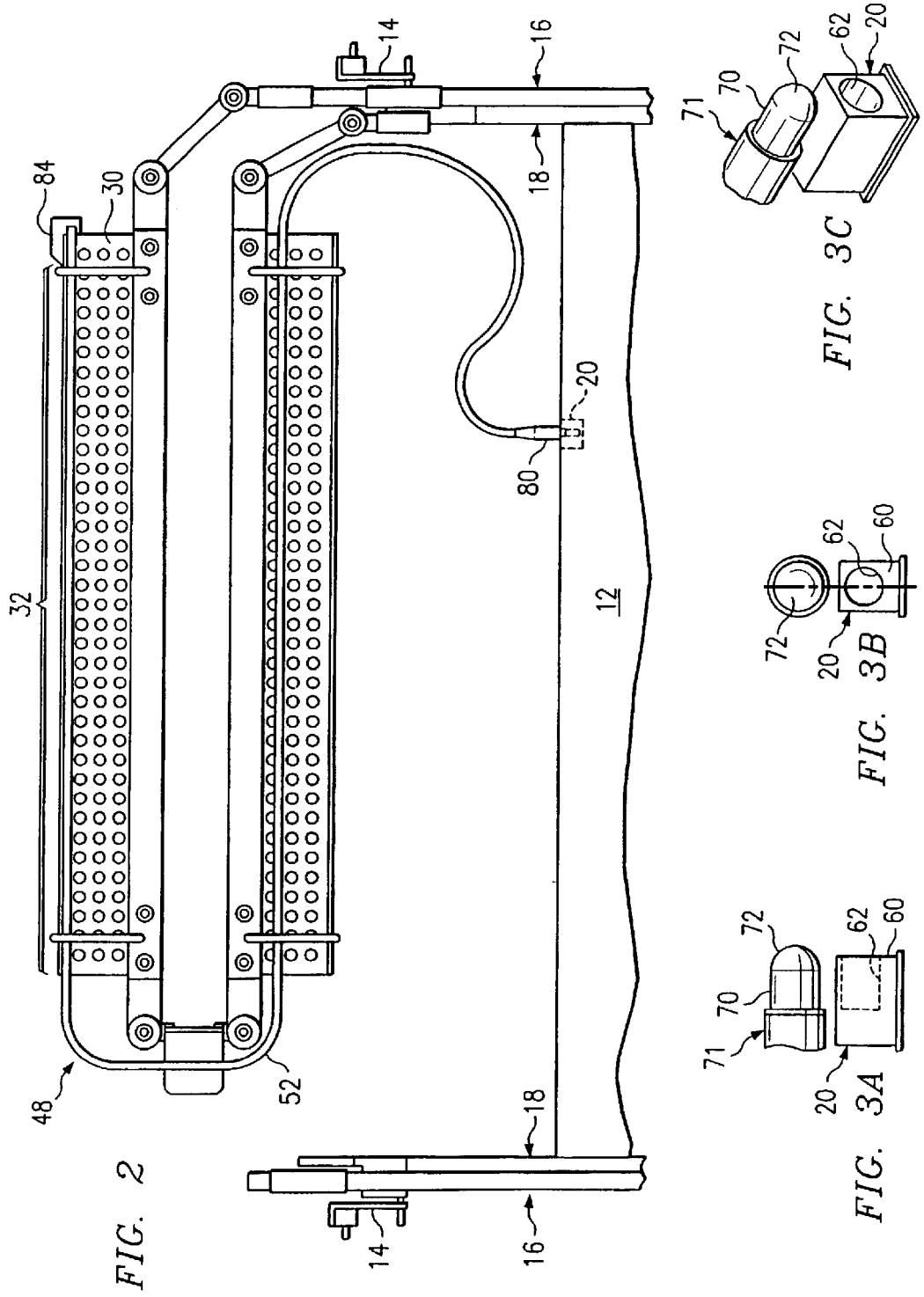

RACK SYSTEM WITH REAR STATUS INDICATOR AND METHOD OF USE

TECHNICAL FIELD

The present invention relates generally to the field of computers and electronic devices and more particularly to electronic equipment racks and rack systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system components are often stored in racks or rack systems such as Electronics Industry Association (EIA) rack standards. Often, information handling system components are stored within racks that utilize slide assemblies to allow information handling system components stored within the rack to slide out from the rack for inspection, repair, installation, removal or maintenance. Typically, cable management assemblies (CMA) are positioned behind information handling system components in the rear of a rack structure. CMAs operate to hold the cabling associated with the information handling system components and allow the information handling system component to slide forward from the rack and back into a recessed position with respect to the rack.

Information handling system components often include status indicators located both at the front and the back of an information handling system component in order to allow a user or system administrator to determine whether or not a particular information handling system is functioning properly. Unfortunately, with respect to status indicators located on the back of an information handling system component, the associated CMAs often visually block the rear status indicator. This may lead to significant problems for technicians and system administrators attempting to locate malfunctioning information handling system components. The problems are increased in large data center operations that include multiple rack systems that each contain multiple information handling system components.

SUMMARY

Therefore a need has arisen for a system or method for facilitating visual status indication of information handling system components stored within rack systems.

In accordance with teachings of the present disclosure, a rack system with a rear status indicator assembly and a method of use thereof are described that reduces or eliminates problems associated with previous systems. In one aspect, an information handling system status indicator assembly is disclosed. The status indicator assembly is preferably used with a rack system incorporating a cable management assembly (CMA). The status indicator assembly includes a power jack, a cabling section, and an indicator. The power jack is able to interface with a rear status port of an information handling system component. The cabling section connects the power jack with the indicator and the indicator is able to indicate the status of the information handling system component. More specifically the indicator may be a light emitting diode (LED) that has a mounting tab for securing the indicator to a selected portion of the cable management assembly.

The present disclosure includes a number of important technical advantages. One important technical advantage is providing a status indicator assembly, including a cabling section and an indicator. The cabling section allows sufficient length for the indicator to be disposed on a portion of the cable management assembly to allow the status of the associated information handling system component to be visible from the back of a rack system.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 shows a top view of an information handling system component within a rack system and utilizing a status indicator assembly;

FIG. 3 depicts features of the power jack and indicator of the status indicator assembly;

DETAILED DESCRIPTION

Preferred embodiments and their advantages are best understood by reference to FIGS. 1 through 5, wherein like numbers are used to indicate like and corresponding parts.

For purposes of this disclosure, an information handling system or information handling system component may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
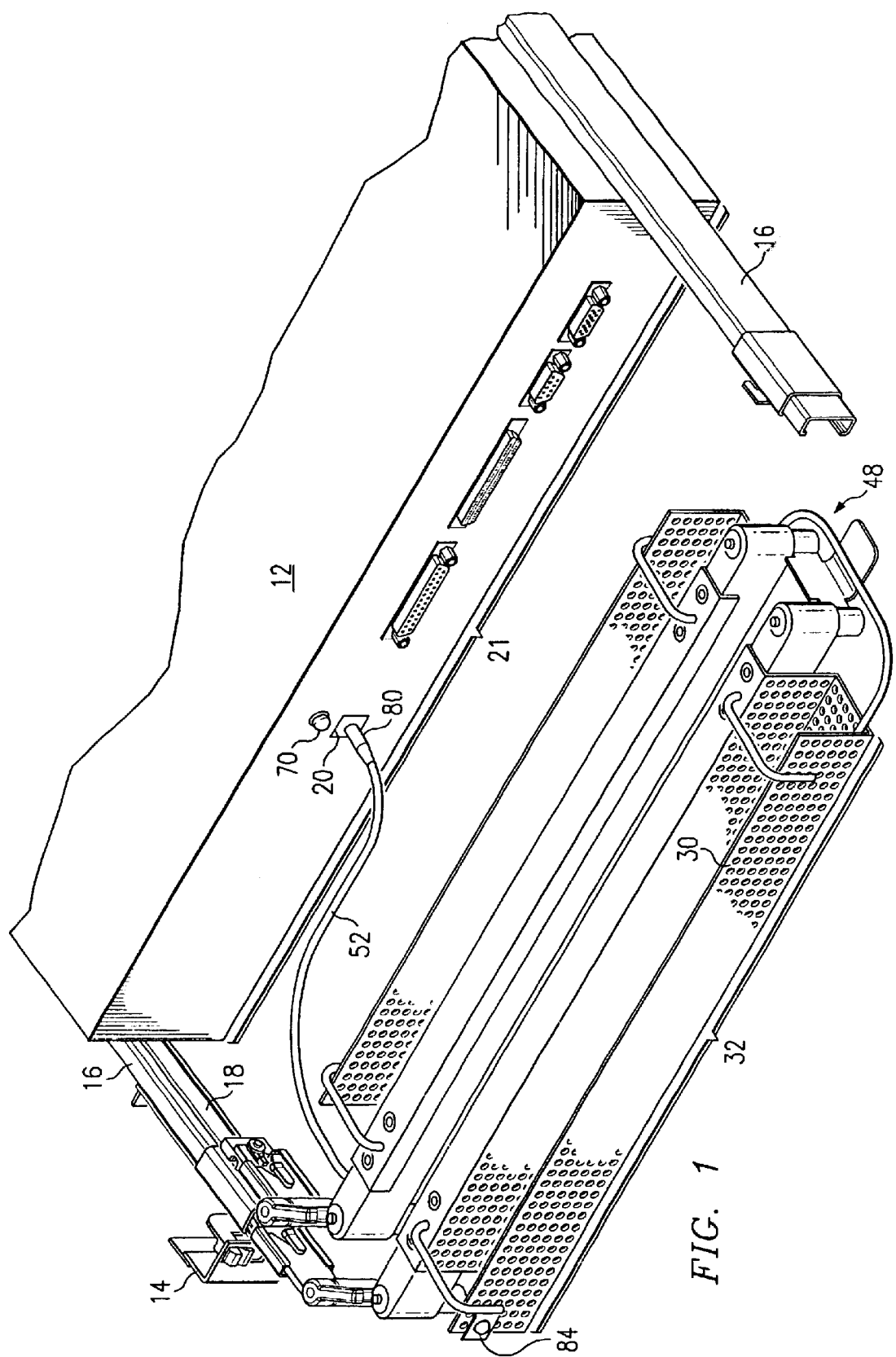
FIG. 1 shows an isometric view of a back portion of an information handling system stored within a rack and utilizing a cable management assembly and a status indicator assembly.

Now referring to FIG. 1, a rear isometric view of an information handling system component sorted within a rack system with portions removed is shown. Information handling system component 12 is disposed within rack 14 (with portions removed). A pair of rack arms 16 and associated rack arm slides or slides 18 are attached to rack 14. Information handling system component 12 is connected directly with slides 18. Slides 18 are slideably associated with the rack arms 16 such that information handling system component 12 may slide between a first position and a second position. The first position (not expressly shown) is extended from the front of rack 14 to allow for access to information handling system component 12 for maintenance, servicing, installation, removal and inspection. Slides 18 also allow information handling system component 12 to be positioned in a second position wherein information handling system component 12 is stored within rack 14 as shown in FIG. 1.

Cable management assembly or CMA 30 is associated with information handling system component 12 and is operable to house cabling associated with information handling system component 12. In the present preferred embodiment CMA 30 is associated with information handling system component 12 by coupling respective arms of CMA 30 to rack arm 16 and rack arm slide 18 such that as information handling system component 12 slides forward into the first position, CMA 30 and the cabling stored therein extends forward. As information handling system component 12 is positioned in the second position (as shown) the arms of CMA 30 fold. In alternative embodiments cable management assembly 30 may connect directly with information handling system component 12 or with portions of rack 14.

Also in the present preferred embodiment, CMA 30 includes basket type arms allowing for associated cabling to be routed through and housed in the basket arms of CMA 30. The present disclosure contemplates the use of alternative cable management assemblies such as cable management assemblies that utilize releasable cable ties to secure the cabling to the CMA arms.

In the present preferred embodiment information handling system component 12 comprises a server component. In some particular embodiments, information handling system component 12 may comprise a one U server (a server that fits with a single standard rack unit.) Additionally, rack 14 may include a plurality of additional information handling system components 12 with associated rack arms 16, rack arm slides 18 and cable management assemblies 30 (not expressly shown). In one particular embodiment, rack 14 may be an EIA-310 standard compliant rack 14 that contains a plurality of one U servers 12 stored therein and each having cable management assemblies 30 and indicator assemblies 48 associated therewith.

Figure 7:
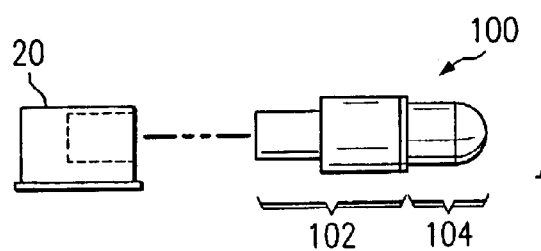
FIG. 7 is a side view of a plug indicator assembly according to teachings of the present disclosure.

Information handling system component 12 includes rear status indication port 20 and chassis level system status indicator 70. In an alternative embodiment, information handling system component 12 may include only rear status indicator port 20. In such an embodiment, if the component is being used in a situation that does not require a CMA, a plug adapter assembly (as shown in FIG. 7) may be used to provide a rear-status indication. A plug adapter assembly may preferably consist of a combined power jack and indicator, similar to power jack 80 and indicator 84 described below.

Port 20 is disposed along the rear portion 21 of information handling system component 12. Port 20 preferably relays a signal that indicates the status of information handling system component 12. In the present embodiment port 20 sends one of two different status signals. The first status signal indicates that information handling system component 12 is functioning properly and the second status signal indicates that a failure has been detected within the information handling system component 12. In an alternative embodiment port 20 may be operable to relay any of a plurality of signals indicating selected system status conditions.

In the present embodiment chassis level system status indicator 70 also receives the status signal available at port 20. Chassis level system status indicator 70 comprises a bicolor indicator operable to indicate either a first status color or a second status color. The first status color indicates that information handling system component 12 is functioning properly. The second status color indicates that information handling system component 12 has experienced a failure or detected an error.

Figure 5:
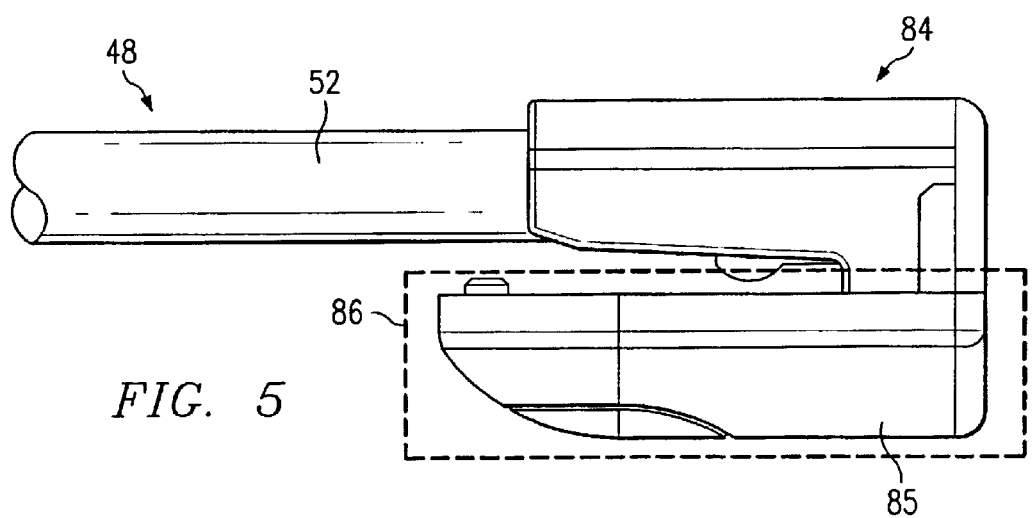
FIG. 5 is a side view of an indicator with a mounting tab.

In the present preferred embodiment status indicator assembly 48 is connected with information handling system component 12 via port 20. Status indicator assembly 48 includes cable 52 which has a first end and a second end. Power jack 80 connects with the first end of cable 52. Indicator 84 connects with the second end of cable 52. Status indicator assembly 48 is preferably routed through cable management assembly 30 and indicator 84 is mounted to a portion of cable management assembly 30. In one embodiment (as shown in FIG. 5, below), indicator 84 includes mounting tab 86 that is formed to selectively and releasably secure indicator 84 to a portion of cable management assembly 30. In the present preferred embodiment cable management assembly 30 includes a mounting groove or notch formed to interface with and receive mounting tab 86 to allow indicator 84 to be disposed on rear face 32 of cable management assembly 30. Accordingly while CMA 30 is in a folded position as shown in the present embodiment, rear face 32 and indicator 84 are visible to a user standing to the rear of rack 14.

FIG. 2 is a top view of rack 14 as shown in FIG. 1 showing status indicator assembly 48 routed through cable management assembly 30.

Figure 4:
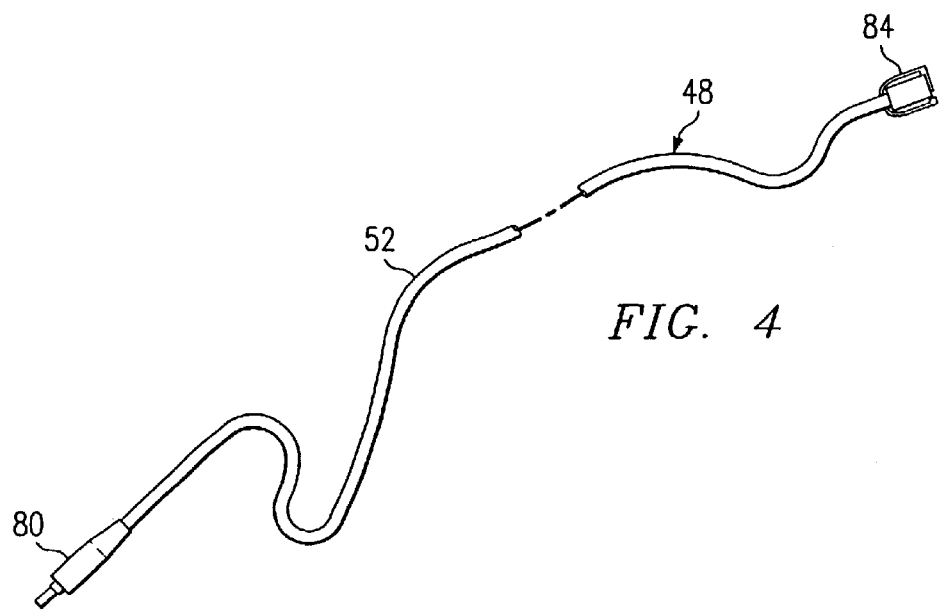
FIG. 4 is an isometric view of a status indicator assembly.

FIG. 3 shows a side, end, and isometric view of port 20 and chassis level system status indicator 70. Port 20 includes exterior housing 60 and cylindrical recess 62. Exterior housing 60 is rectangular in shape and also includes cylindrical recess 62. Cylindrical recess is preferably a cylindrical or barrel-type recess formed to interface with a connector such as power jack 80 (as shown in FIG. 4.) Power jack 80 is operable to connect with cabling such as cabling 52. Additionally, the present disclosure contemplates power jack 80 as a two leaded power jack in the present embodiment. In an alternative embodiment power jack 80 may comprise a single pole connector. The present disclosure also contemplates the use of other power jack types suitable for connecting with a status indication output port.

A single pole connector may include stereo jacks (three leaded, and various non-standard single pole connectors that advantageously take up only a small amount of space.

Chassis level system status indicator 70 includes a generally cylindrical housing with the base portion 71 located on one end with a slightly enlarged diameter. The other end of chassis level indicator 70 includes translucent hemispherical end 72. In the present embodiment, indicator 70 includes a bicolored light emitting diode (LED). Chassis level indicator 70 receives status indication signals from information handling system component 12. In response, the LED of chassis level indicator indicates either a first signal color or a second signal color. In the present preferred embodiment the first signal color comprises a blue color and the second signal color comprises and amber color. Also, in the present preferred embodiment, the first signal color indicates that information handling system component 12 is functioning properly and the second signal color indicates that the associated information handling system component 12 has detected a failure. Translucent hemispherical end 72 allows light from the LED within chassis level indicator 70 to be visible.

FIG. 4 is an isometric view of a status indicator assembly depicted generally at 48. Status indicator assembly includes power jack 80 connected with cabling 52 which in turn is connected with status indicator 84. In the present embodiment status indicator 84 may include a mounting tab such as mounting tab 86. Mounting tab 55 is preferably formed to interface with a portion of a cable management assembly as described above. In the present embodiment, status indicator assembly 48 may be referred to as a "Cyclops" indicator.

Now referring to FIG. 5, a side view of status indicator assembly 46, with portions broken away, is shown. Indicator 84 connects with cabling 52. Indicator 84 includes light emitting diode (LED) 85 and mounting tab 86. In the present embodiment LED 85 is a bicolored LED that may indicate either a first signal color or a second signal color, similar to the LED associated with chassis level status indicator 70. The extension of the body of indicator 84 within the dashed-line box forms mounting tab 86. In the present preferred embodiment mounting tab 86 forms a slot or groove with respect to the body of indicator 84. The groove formed by mounting tab 86 is sized to interfere with a portion of CMA 30. In a preferred embodiment, CMA 30 may include a notch or slot formed to allow indicator 84 to be selectively disposed thereon. In an alternative embodiment, mounting tab 86 may use an alternate geometry to interface with CMA 30.

Figure 6:
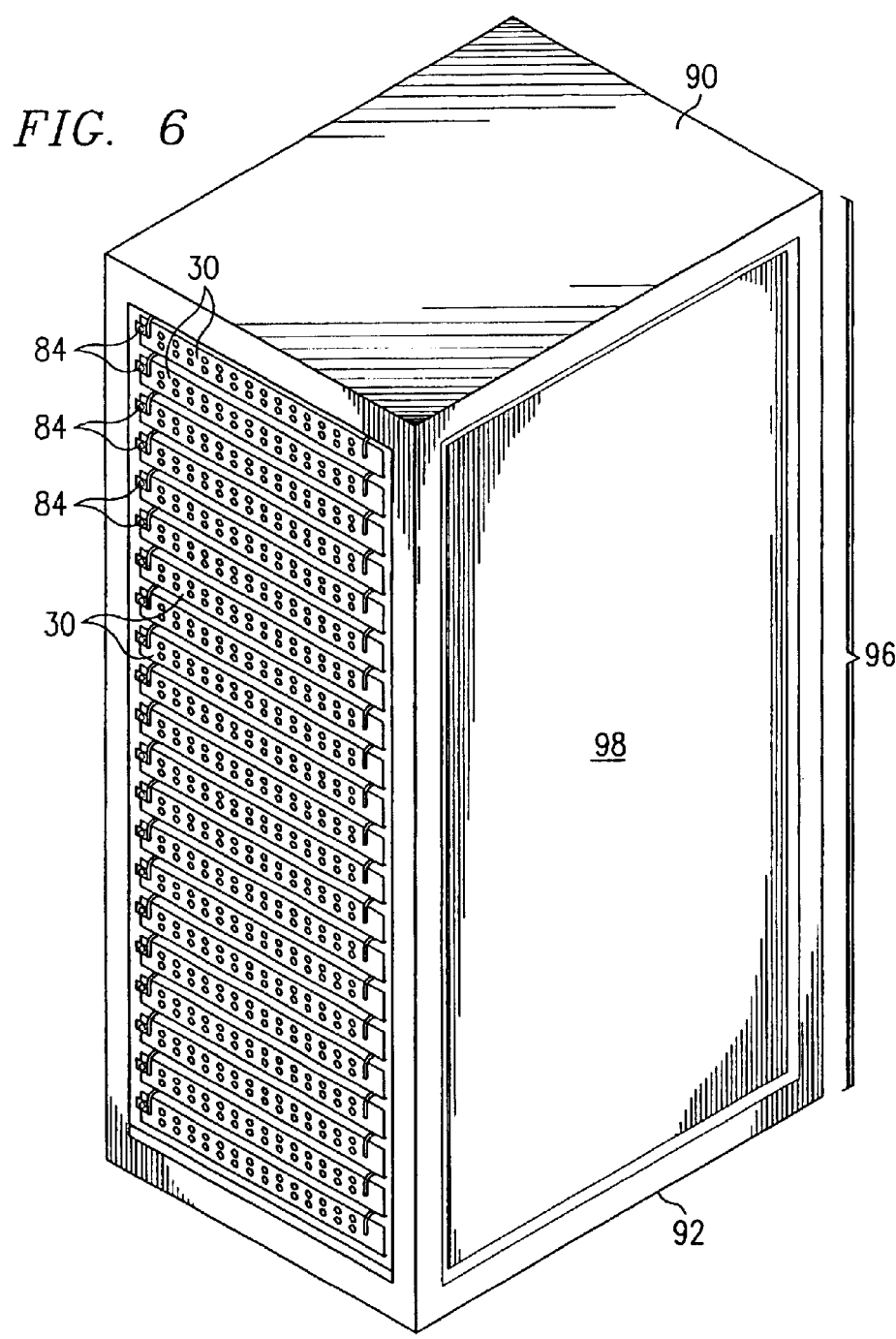
FIG. 6 is an isometric view of the rear portion of a rack system utilizing a plurality of information handling system components, cable management assemblies, and rear status indicators assemblies according to teachings of the present disclosure.

Now referring to FIG. 6 a rack system with a plurality of cable management assemblies and status indicator assemblies. Rack 16 includes top 90, bottom 92, front 94, rear 96 and sides 98. Rack system 16 is preferably a standard rack such as an EIA-310 compliant electronics equipment rack. In an alternative embodiment, any suitable standard rack for disposing electronic equipment or information handling system components may be used with the present disclosure. Plurality of cable management assemblies 30 are associated with information handling system components (not expressly shown) and operate to hold cabling associated therewith. Each cable management assembly 30 has an indicator 84 attached thereto.

In operation, information handling system components are stored within rack 16. Cabling associated with each information handling system component is attached to each respective information handling system component and routed through the CMA 30 associated with each individual information handling system component. A status indicator assembly (such as indicator assembly 48 as shown in FIG. 4) is connected with the rear status port of each information handling system component. The cabling of each status indicator assembly is routed through the arms of each respective cable management assembly and the indicator portion is disposed on a rear facing surface of each cable management assembly 30. In this manner a user or system administrator accessing the back of rack 16 can visually assess the status of the information handling system component stored therein.

FIG. 7 is a side view of a plug indicator assembly 100 according to teachings of the present disclosure. Plug indicator assembly 100 includes power jack 102 disposed directly adjacent indicator 104. Power jack 102 is preferably sized to interface with port 20. Plug indicator assembly 100 provides an alternative indicator assembly to be utilized with information handling system components that do not require a cable management assembly.

Although the disclosed embodiments have been described in detail, it should be understood that various changes, substitutions and alterations can be made to the embodiments without departing from their spirit and scope.

What is claimed is:

1. An information handling system status indicator assembly for use with a rack system utilizing a cable management assembly comprising:
   a power jack operable to interface with a rear status port of an information handling system;
   a cabling section connected with the power jack, at a first end, the cabling section having a length operable to extend the length of the cable management assembly; and
   an indicator connected to a second end of the cabling section, the indicator operable to indicate the status of the information handling system component.

2. The status indicator assembly of claim 1 wherein the indicator further comprises a light emitting diode (LED).

3. The status indicator assembly of claim 1 where the indicator further comprises a mounting tab operable to selectively secure the indicator to a portion of the cable management assembly.

4. The status indicator assembly of claim 1 wherein the power jack further comprises a two leaded power jack.

5. The status indicator assembly of claim 1 wherein the power jack further comprises a three leaded power jack.

6. The status indicator assembly of claim 1 wherein the status indicator comprises an LED operable to indicate a first signal color and a second signal color.

7. The status indicator assembly of claim 6 wherein:
   the first signal color indicates proper functioning of the associated information handling system; and
   the second signal color indicates that the associated information handling system has detected a failure.

8. The status indicator assembly of claim 1 wherein the power jack comprises a single pole connector.

9. The status indicator assembly of claim 1 further comprising a plug assembly operable to interface with an information handling system not utilizing a cable management assembly, the plug assembly having a power jack connected directly adjacent a status indicator.

10. A rack system comprising:
    a rack for storing information handling system components, the rack having a front, a back, a top, a bottom, and two sides;
    a pair of slide assemblies disposed in the rack;

an information handling system component secured to the pair of slide assemblies such that the information handling system may be selectively moved between a first position within the rack and a second position extended from the front of the rack;

a cable management assembly connected with the rack and operable to retain cabling associated with the information handling system component;

a status port disposed on a rear portion of the information handling system component;

an information handling system status indicator assembly including a power jack, a cabling section, and an indicator, the power jack operable to connect with the status part.

11. The rack system of claim 10 wherein the indicator comprises a light emitting diode (LED).

12. The rack system of claim 10 wherein the indicator comprises a mounting tab operable to selectively secure the indicator to a portion of the cable management assembly.

13. The rack system of claim 10 wherein the power jack further comprises a two-leaded power jack.

14. The rack system of claim 10 further comprising the status indicator operable to indicate a first signal color to indicate the proper operation of the associated information handling system and a second signal operable to indicate that a failure has been detected in the associated information handling system.

15. The rack system of claim 10 wherein the associated information handling system component comprises a server.

16. The rack system of claim 10 further comprising:

a plurality of information handling system components stored within the rack;

each of the plurality of information handling system components having an associated cable management assembly; and each of the plurality of information handling system components also having a status indicator assembly associated therewith.

17. The rack system of claim 16 further comprising:

each status indicator assembly power jack connected with each respective information handling system status port and each indicator secured to each respective cable management assembly.

18. The rack system of claim 10 wherein the information handling system component further comprises a chassis-level rear status indicator disposed adjacent to the status port.

19. A method for storing information handling system components comprising:

attaching an information handling system component to a slide assembly disposed within a rack system;

disposing a cable management assembly proximate the information handling system;

connecting a power jack of a status indicator assembly to a rear status port of the information handling system component and;

connecting an indicator portion of the indicator assembly to a portion of the cable management assembly.

20. The method of claim 19 further comprising:

activating a first signal color of the indicator to indicate proper functioning of the information handling system component; and activating a second signal color of the indicator to indicate that the information handling system has detected a failure.

* * * * *